(12) United States Patent
Wuu et al.

(10) Patent No.: US 9,054,275 B1
(45) Date of Patent: Jun. 9, 2015

(54) LIGHT EMITTING DIODE

(71) Applicant: National Chung-Hsing University, Taichung (TW)

(72) Inventors: Dong-Sing Wuu, Taichung (TW); Ray-Hua Horng, Taichung (TW); Tsung-Yen Tsai, Taichung (TW)

(73) Assignee: National Chung-Hsing University, Taichung (TW)

( * ) Notice: Subject to any disclaimer, the term of this patent is extended or adjusted under 35 U.S.C. 154(b) by 0 days.

(21) Appl. No.: 14/558,507

(22) Filed: Dec. 2, 2014

(30) Foreign Application Priority Data

Dec. 23, 2013 (TW) .............................. 102147752 A

(51) Int. Cl.
*H01L 33/40* (2010.01)
*H01L 33/36* (2010.01)
*H01L 33/06* (2010.01)
*H01L 33/32* (2010.01)

(52) U.S. Cl.
CPC ................ *H01L 33/36* (2013.01); *H01L 33/06* (2013.01); *H01L 33/32* (2013.01); *H01L 33/40* (2013.01)

(58) Field of Classification Search
CPC ......... H01L 33/06; H01L 33/32; H01L 33/36; H01L 33/40
USPC ....................................... 257/13, 30
See application file for complete search history.

(56) References Cited

U.S. PATENT DOCUMENTS

| | | | |
|---|---|---|---|
| 2003/0211645 A1* | 11/2003 | Lee et al. ........................ | 438/46 |
| 2004/0245535 A1* | 12/2004 | D'Evelyn et al. ............... | 257/94 |
| 2005/0127391 A1* | 6/2005 | Yanamoto ..................... | 257/103 |
| 2005/0139825 A1* | 6/2005 | Song et al. ..................... | 257/44 |
| 2007/0254391 A1* | 11/2007 | Song et al. ..................... | 438/29 |
| 2008/0116477 A1* | 5/2008 | Komada ........................ | 257/103 |
| 2010/0032648 A1* | 2/2010 | Lu et al. ......................... | 257/13 |

* cited by examiner

*Primary Examiner* — Allan R Wilson
(74) *Attorney, Agent, or Firm* — Allston L. Jones; Peters Verny, LLP

(57) ABSTRACT

A light emitting diode includes an epitaxial substrate, an active layer, a tunneling layer, a current spreading layer, and an electrode unit. The active layer includes a first conductive type film, a quantum well structure, and a second conductive type film that is made from $Al_yIn_zGa_{(1-y-z)}N$, wherein $0<y<1$, $0 \leq z<1$, and $0<(y+z) \leq 1$. The tunneling layer is stacked on the second conductive type film and is made from $Al_xIn_{1-x}N$, wherein $0<x<1$ and $x>y$. The tunneling layer has a band gap greater than that of the second conductive film. The current spreading layer is stacked on the tunneling layer.

10 Claims, 5 Drawing Sheets

LIGHT EMITTING DIODE

CROSS-REFERENCE TO RELATED APPLICATION

This application claims priority of Taiwanese Patent Application No. 102147752, filed on Dec. 23, 2013.

FIELD OF THE INVENTION

This invention relates to a light emitting diode, more particularly to a light emitting diode including an electron tunneling layer.

BACKGROUND OF THE INVENTION

FIG. 1 illustrates a conventional UV light emitting diode (UV LED) that includes an epitaxial substrate 11, an active layer 12 which is disposed on the epitaxial substrate 11, a transparent conducting layer 14 which is disposed on the active layer 12, and an electrode unit 15 which transmits an external energy to the active layer 12. When the external energy is transmitted into the active layer 12, the active layer 12 generates UV light.

The epitaxial substrate 11 is made from sapphire. The active layer 12 includes a quantum well structure having alternately disposed AlGaN layers and GaN layers. The transparent conducting layer 14 is made from a material with low contact resistance and high transmittance.

The structure of the UV LED is similar to that of a blue LED. Both the blue LED and the UV LED have the same drawbacks, such as heat dissipation problem, current spreading problem, or epitaxial mismatching problem. Because the wavelength of the UV LED is smaller than that of the blue LED, the current spreading problem of the UV LED is much worse than that of the blue LED.

In order to solve the current spreading problem of the UV LED, a current spreading layer (not shown) may be included in the aforementioned UV LED. The current spreading layer is usually made from $Ga_2O_3$:Zn (ZGO). However, since the current spreading layer has a work function smaller than that of the active layer 12, the current spreading layer cannot form an ohmic contact with the active layer 12.

SUMMARY OF THE INVENTION

Therefore, the object of the present invention is to provide a light emitting diode with a tunneling layer that can overcome the aforesaid drawbacks associated with the prior art.

According to this invention, there is provided a light emitting diode that comprises: an epitaxial substrate; an active layer including a first conductive type film that is disposed on the epitaxial substrate, a quantum well structure that is formed on the first conductive type film, and a second conductive type film that is formed on the quantum well structure, the active layer being able to generate light which has a wavelength smaller than 400 nm when applied with an external electric energy, the second conductive type film being made from $Al_yIn_zGa_{(1-y-z)}N$, wherein $0<y<1$, $0≤z<1$, and $0<(y+z)≤1$; a tunneling layer stacked on and contacting the second conductive type film and made from $Al_xIn_{1-x}N$, wherein $0<x<1$ and $x>y$, the tunneling layer having a layer thickness not greater than 20 nm and a band gap greater than that of the second conductive type film; a current spreading layer stacked on and contacting the tunneling layer; and an electrode unit electrically connected to an assembly of the active layer, the tunneling layer and the current spreading layer for transmitting the external electric energy to the assembly of the active layer, the tunneling layer and the current spreading layer.

BRIEF DESCRIPTION OF THE DRAWINGS

In drawings which illustrate embodiments of the invention.

DETAILED DESCRIPTION OF THE EMBODIMENTS

Figure 1:
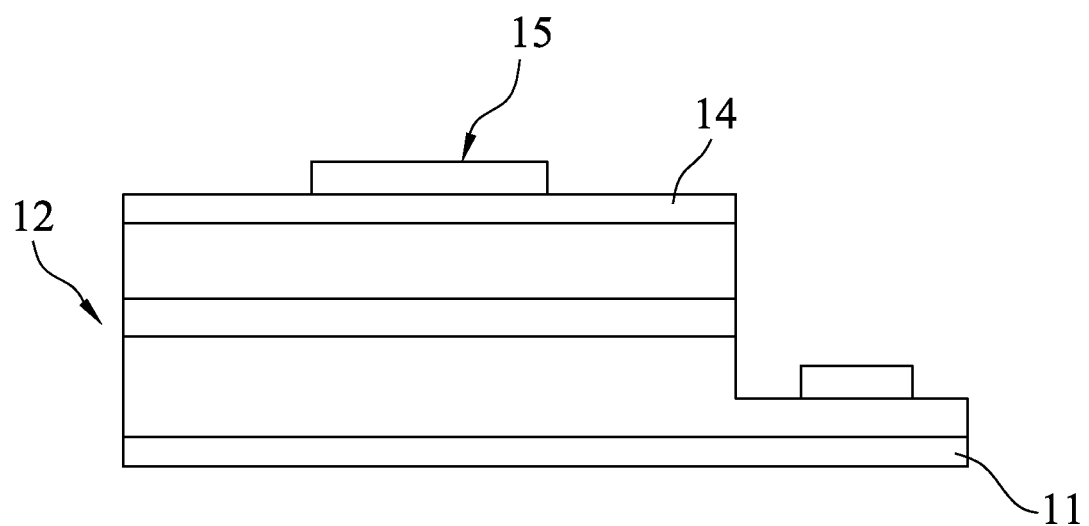
FIG. 1 is a schematic diagram of a conventional UV light emitting diode.
Figure 2:
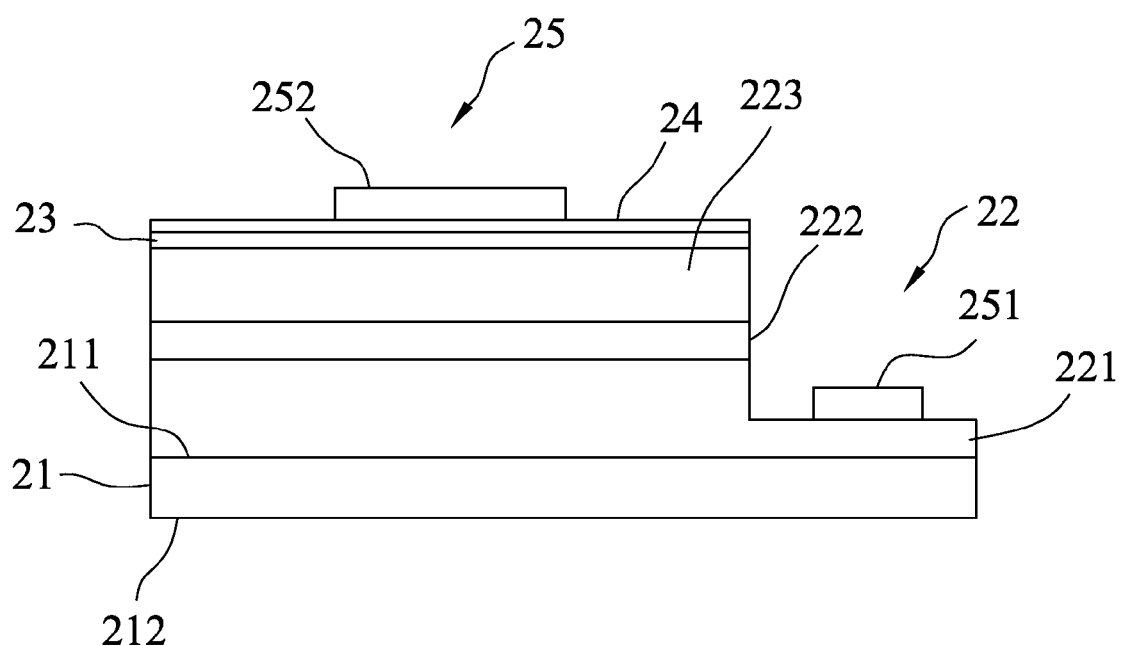
FIG. 2 is a schematic diagram of the first embodiment of a light emitting device according to the present invention.

FIG. 2 illustrates the first embodiment of a light emitting diode (LED) according to the present invention. In this embodiment, the LED is a horizontal type LED, and includes an epitaxial substrate 21, an active layer 22, a tunneling layer 23, a current spreading layer 24, and an electrode unit 25.

The active layer 22 includes a first conductive type film 221 that is disposed on the epitaxial substrate 21, a quantum well structure 222 that is formed on the first conductive type film 221, and a second conductive type film 223 that is formed on the quantum well structure 222. The active layer 22 is able to generate light which has a wavelength smaller than 400 nm when applied with an external electric energy. The second conductive type film 223 is made from $Al_yIn_zGa_{(1-y-z)}N$, wherein $0<y<1$, $0≤z<1$, and $0<(y+z)≤1$.

The tunneling layer 23 is stacked on and contacts the second conductive type film 223, and is made from $Al_xIn_{1-x}N$, wherein $0<x<1$ and $x>y$. The tunneling layer 23 has a layer thickness not greater than 20 nm, and a band gap greater than that of the second conductive type film 223.

The current spreading layer 24 is stacked on and contacts the tunneling layer 23.

The electrode unit 25 is electrically connected to an assembly of the active layer 22, the tunneling layer 23 and the current spreading layer 24 for transmitting the external electric energy to the assembly of the active layer 22, the tunneling layer 23 and the current spreading layer 24.

The epitaxial substrate 21 has a top surface 211 and a bottom surface 212 that is opposite to the top surface 211. The active layer 22 is epitaxially grown on the top surface 211. The epitaxial substrate 21 is made from a material selected from the group consisting of sapphire, silicon, AlN, GaN, and SiC. Preferably, the epitaxial substrate 21 is made from sapphire or AlN. Both sapphire and AlN do not absorb UV light, and exhibit good lattice match for growth of the active layer 22 thereon.

The quantum well structure 222 of the active layer 22 is preferably made from a material selected from AlInN, AlInGaN, and the combination thereof. Preferably, the first conductive film 221 of the active layer 22 is made from n-doped $Al_yIn_zGa_{(1-y-z)}N$, the quantum well structure 222 of the active layer is made from $Al_yIn_zGa_{(1-y-z)}N$, and the second conductive type film 223 of the active layer 22 is made from p-doped $Al_yIn_zGa_{(1-y-z)}N$.

Optionally, the LED may further include a reflective layer (not shown) disposed between the active layer 22 and the epitaxial substrate 21.

The tunneling layer 23 may be n-type $Al_xIn_{1-x}N$, p-type $Al_xIn_{1-x}N$ or an intrinsic $Al_xIn_{1-x}N$. When the thickness of the tunneling layer 23 is greater than 20 nm, it may not induce a quantum tunneling effect. In this embodiment, the tunneling layer 23 is made from p-doped $Al_xIn_{1-x}N$, and the second conductive type film 223 is also made from p-doped AlInN. The band gap of the tunneling layer 23 is greater than that of the second conductive type film 223 (x>y). If the band gap of the tunneling layer 23 is smaller than that of the second conductive type film 223 (x<y), the tunneling layer 23 may have a tendency to absorb light emitted from the active layer 22.

The current spreading layer 24 is made from a material which has a transmittance not smaller than 50% for a wavelength of about 300 nm. Preferably, the current spreading layer 24 is made from ZGO ($Ga_2O_3$:Zn).

Preferably, the current spreading layer 24 has a work function smaller than that of the second conductive type film 223, and the band gap of the tunneling layer 23 is greater than that of the second conductive type film 223, such that charges may pass through the tunneling layer 23 from the current spreading layer 24 to the second conductive type film 223 by way of the tunneling effect more efficiently.

The electrode unit 25 includes a top electrode 252 that is stacked on and contacts the current spreading layer 24, and a bottom electrode 251 that is stacked on and contacts the first conductive type film 221. The electrode unit 25 is preferably made from Ti/Au or Ti/Al, and forms an ohmic contact with each of the first conductive type film 221 and the current spreading layer 24. The electrode unit 25 may be formed using electron beam evaporating process or electron beam sputtering process, followed by thermal annealing in $O_2$ or air atmosphere.

Figure 3:
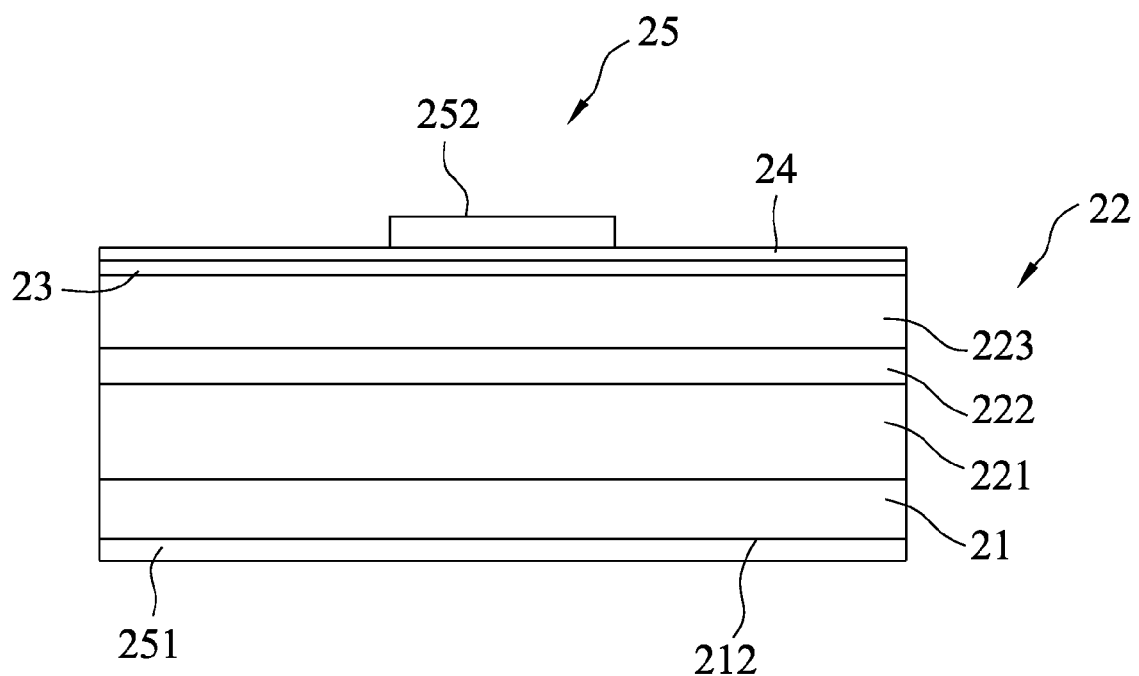
FIG. 3 is a schematic diagram of the second embodiment of a light emitting device according to the present invention.

FIG. 3 illustrates the second embodiment of the LED according to the present invention. The LED of the second embodiment is a vertical type LED. The second embodiment differs from the first embodiment in that the electrode unit 25 includes a top electrode 252 that is stacked on and contacts the current spreading layer 24, and a bottom electrode 251 that is formed on the bottom surface 212 of the epitaxial substrate 21.

Figure 4:
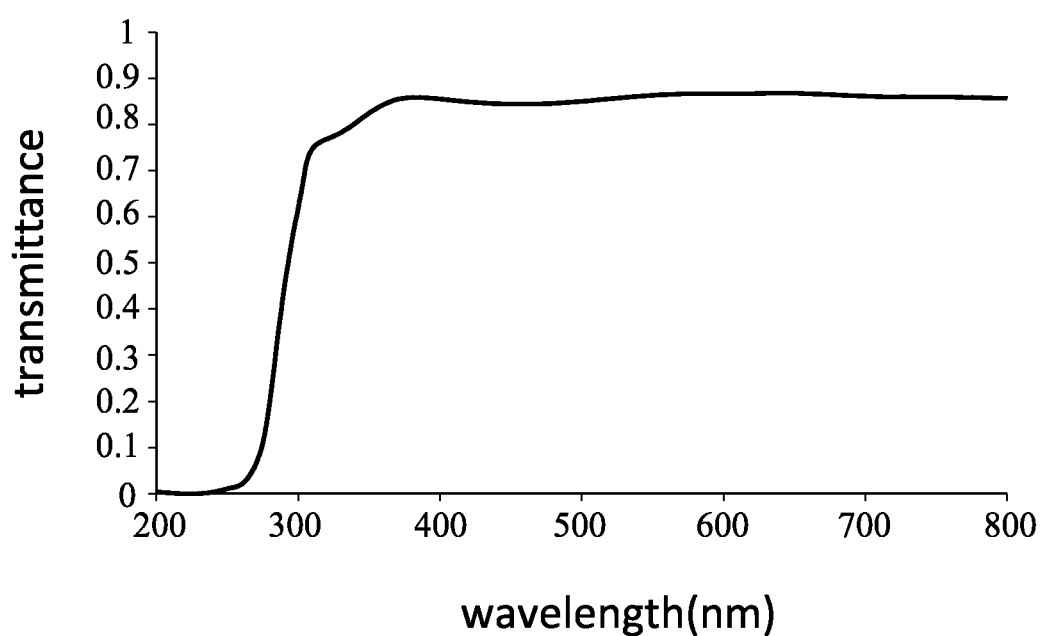
FIG. 4 is a plot showing the transmittance of a ZGO film of Example 1.

FIG. 4 illustrates the transmittance of the ZGO film of Example 1 for different wavelengths of light. The transmittance of the ZGO film is greater than 0.6 (60%) for light having a wavelength greater than 300 nm.

The merits of the embodiments of this invention will become apparent with reference to the following Examples and Comparative Example.

Figure 5:
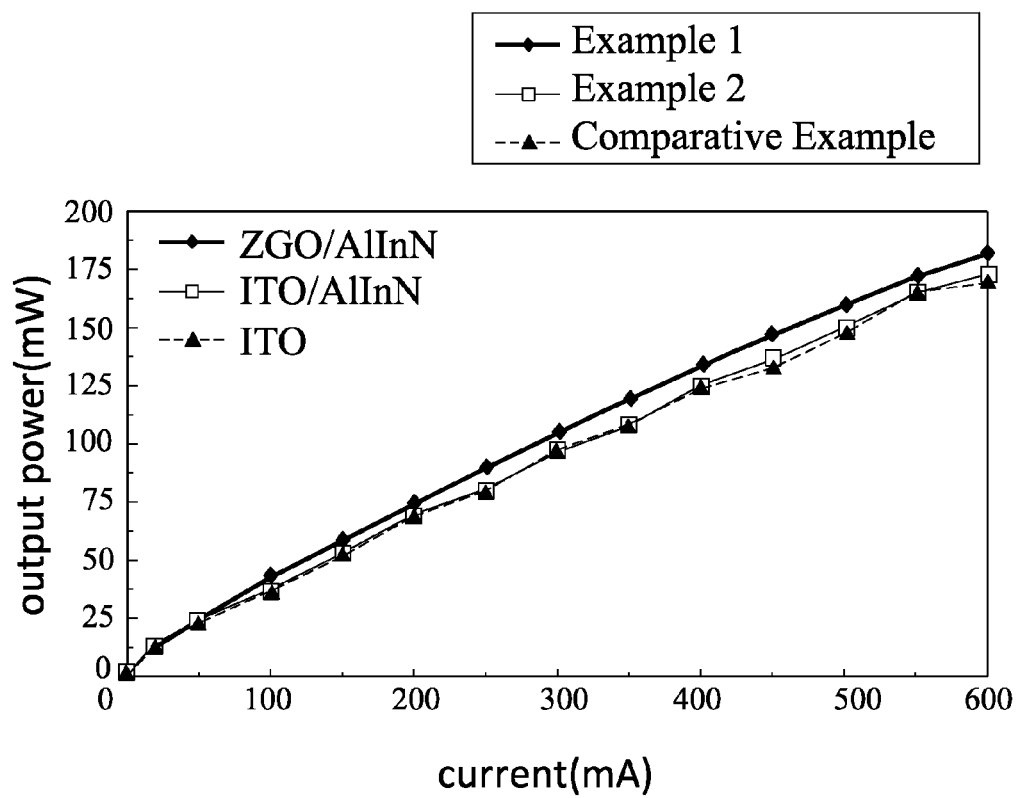
FIG. 5 is a plot showing the output power of Examples 1 and 2 and Comparative Example at different currents.

FIG. 5 illustrates the output powers of the LEDs for Examples 1 and 2 and Comparative Example (without the tunneling layer 23). In Example 1, the current spreading layer 24 is made from ZGO, and the tunneling layer 23 is made from $Al_{0.8}In_{0.2}N$. The thickness of the tunneling layer is 2 nm. Example 2 differs from Example 1 in that the current spreading layer 24 is made from ITO. The current spreading layer 24 of Comparative Example is made from ITO. The output power of Example 1 is much better than that of Comparative Example, and the output power of Example 2 is slightly better than that of Comparative Example. It is noted that if the current spreading layer of Comparative Example is made from ZGO, there is no ohmic contact but only Schottky contact between the current spreading layer and the second conductive type film of the active layer, such that the output power becomes worse. With the inclusion of the tunneling layer 23 of $Al_xIn_{1-x}N$ in the LED of this invention, the aforesaid drawbacks associated with the prior art may be alleviated.

While the present invention has been described in connection with what are considered the most practical embodiments, it is understood that this invention is not limited to the disclosed embodiments but is intended to cover various arrangements included within the spirit and scope of the broadest interpretation and equivalent arrangements.

What is claimed is:

1. A light emitting diode comprising:
    an epitaxial substrate;
    an active layer including a first conductive type film that is disposed on said epitaxial substrate, a quantum well structure that is formed on said first conductive type film, and a second conductive type film that is formed on said quantum well structure, said active layer being able to generate light which has a wavelength smaller than 400 nm when applied with an external electric energy, said second conductive type film being made from $Al_yIn_zGa_{(1-y-z)}N$, wherein $0<y<1$, $0\leq z<1$, and $0<(y+z)\leq 1$;
    a tunneling layer stacked on and contacting said second conductive type film and made from $Al_xIn_{1-x}N$, wherein $0<x<1$ and x>y, said tunneling layer having a layer thickness not greater than 20 nm, and a band gap greater than that of said second conductive type film;
    a current spreading layer stacked on and contacting said tunneling layer; and
    an electrode unit electrically connected to an assembly of said active layer, said tunneling layer and said current spreading layer for transmitting the external electric energy to the assembly of said active layer, said tunneling layer and said current spreading layer.

2. The light emitting diode of claim 1, wherein said current spreading layer has a work function smaller than that of said second conductive type film of said active layer.

3. The light emitting diode of claim 1, wherein said electrode unit includes a top electrode that is stacked on and that contacts said current spreading layer, and a bottom electrode that is stacked on and that contacts said first conductive type film.

4. The light emitting diode of claim 2, wherein said current spreading layer is made from ZGO ($Ga_2O_3$:Zn).

5. The light emitting diode of claim 3, wherein said first conductive film of said active layer is made from n-doped $Al_yIn_zGa_{(1-y-z)}N$, and said second conductive film of said active layer is made from p-doped $Al_yIn_zGa_{(1-y-z)}N$.

6. The light emitting diode of claim 5, wherein said quantum well structure of said active layer is made from $Al_yIn_zGa_{(1-y-z)}N$.

7. The light emitting diode of claim 1, wherein said electrode unit includes a top electrode that is stacked on and that contacts said current spreading layer, and a bottom electrode that is formed on a bottom surface of said epitaxial substrate.

8. The light emitting diode of claim 7, wherein said current spreading layer is made from ZGO ($Ga_2O_3$:Zn).

9. The light emitting diode of claim 7, wherein said first conductive film of said active layer is made from n-doped $Al_yIn_zGa_{(1-y-z)}N$, and said second conductive film of said active layer is made from p-doped $Al_yIn_zGa_{(1-y-z)}N$.

10. The light emitting diode of claim 9, wherein said quantum well structure of said active layer is made from $Al_yIn_zGa_{(1-y-z)}N$.

* * * * *